(12) United States Patent
Garros et al.

(10) Patent No.: US 9,689,913 B2
(45) Date of Patent: Jun. 27, 2017

(54) METHOD AND DEVICE FOR MEASURING CHANGES OVER TIME OF THE ELECTRICAL PERFORMANCE OF AN FDSOI TRANSISTOR

(71) Applicants: COMMISSARIAT A L'ENERGIE ATOMIQUE ET AUX ENEERGIES ALTERNATIVES, Paris (FR); STMICROELECTRONICS (CROLLES 2) SAS, Crolles (FR)

(72) Inventors: Xavier Garros, Grenoble (FR); Laurent Brunet, Grenoble (FR)

(73) Assignees: Commissariat à l'énergie atomique et aux énergies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 933 days.

(21) Appl. No.: 13/760,436

(22) Filed: Feb. 6, 2013

(65) Prior Publication Data

US 2013/0218492 A1 Aug. 22, 2013

(30) Foreign Application Priority Data

Feb. 16, 2012 (FR) ..................... 12 51415

(51) Int. Cl.
  *G01R 31/26* (2014.01)
  *G06F 17/00* (2006.01)
(52) U.S. Cl.
  CPC ..... *G01R 31/2607* (2013.01); *G01R 31/2621* (2013.01); *G01R 31/2642* (2013.01); *G06F 17/00* (2013.01)
(58) Field of Classification Search
  CPC ............ G01R 31/2642; G01R 31/2621; G01R 31/2607

(Continued)

(56) References Cited

U.S. PATENT DOCUMENTS

2005/0239298 A1* 10/2005 Damlencourt .......... C23C 16/14
  438/785
2009/0132974 A1* 5/2009 Yoshimoto .......... G06F 17/5036
  716/136

(Continued)

FOREIGN PATENT DOCUMENTS

EP   1 591 558 B1   7/2007
EP   2 290 386 A1   3/2011

OTHER PUBLICATIONS

Garros et al, Investigation of HfO2 Dielectric Stacks Deposited by ALD with a Mercury Probe, Research Gate, Oct. 2002, DOI: 10.1109/ESSDERC.2002.194955 • Source: IEEE Xplore, pp. 411-414.*

(Continued)

*Primary Examiner* — Regis Betsch
*Assistant Examiner* — Lisa Peters
(74) *Attorney, Agent, or Firm* — Oblon, McClelland, Maier & Neustadt, L.L.P.

(57) ABSTRACT

A method for measuring the changes of the electrical performance of an FDSOI transistor between a first and a second state of the transistor after an operating period $t_1$, including the following steps:
  measurement of the transistor's capacities $C_1$ and $C_2$ respectively in the first and second states, according to a voltage $V_{FG}$ applied between the gate and the source and drain areas,
  determination, in relation to characteristic $C_1(V_{FG})$ varying between a maximum value $C_{max}$ and a minimum value $C_{min}$, with three inflection points, of an ordinate value $C_{plat}$ of $C_1(V_{FG})$ at the second inflection point of $C_1(V_{FG})$, and of two abscissa values $V_{Upper(0)}$ and $V_{Lower(0)}$ of $C_1(V_{FG})$ according to equations $V_{Upper(0)} = C_1^{-1}((C_{max}+C_{plat})/2)$ and $V_{Lower(0)} = C_1^{-1}((C_{min}+C_{plat})/2)$, (Continued)

determination, from characteristic $C_2(V_{FG})$, of two abscissa values $V_{Upper(t1)}$ and $V_{Lower(t1)}$ of $C_2(V_{FG})$ according to equations $V_{Upper(t1)} = C_2^{-1}((C_{max}+C_{plat})/2)$ and $V_{Lower(t1)} = C_2^{-1}((C_{min}+C_{plat})/2)$, determination of variations of defect densities $\Delta D_{it1}$, $\Delta D_{it2}$ between the transistor's first and second states, at the transistor's front and back interfaces, from values $\Delta V_{Upper(t1)} = V_{Upper(t1)} - V_{Upper(0)}$ and $\Delta V_{Lower(t1)} = V_{Lower(t1)} - V_{lower(0)}$.

9 Claims, 7 Drawing Sheets

(58) Field of Classification Search
USPC .............. 702/183, 185, 182, 179, 176, 181
See application file for complete search history.

(56) References Cited

U.S. PATENT DOCUMENTS

| | | | |
|---|---|---|---|
| 2011/0050253 A1* | 3/2011 | Garros | G01R 31/2621 324/658 |
| 2014/0132870 A1* | 5/2014 | Kubota | G02F 1/1396 349/43 |

OTHER PUBLICATIONS

French Preliminary Search Report issued Oct. 25, 2012 in Patent Application No. 1251415 with English translation of categories of cited documents.

L. Brunet, et al., "New method to extract interface states density at the Back and the Front gate interfaces of FDSOI transistors from CV-GV measurements", SOI Conference, IEEE, XP31561486A, 2009, 2 pages.

* cited by examiner

METHOD AND DEVICE FOR MEASURING CHANGES OVER TIME OF THE ELECTRICAL PERFORMANCE OF AN FDSOI TRANSISTOR

TECHNICAL FIELD

The invention relates to a method and a device for measuring, or assessing, changes over time of the electrical performance of transistors of the FDSOI type, i.e. of fully depleted transistors of the semiconductor on insulator type.

The invention is used in particular to study the ageing of FDSOI transistors, by assessing changes over time, after a certain period of use, of the defect densities at the transistors' dielectric/semiconductor interfaces, since the electrical performance of the FDSOI transistors is directly dependent on the quality of these interfaces, and therefore on the defect densities present at these interfaces.

STATE OF THE PRIOR ART

Figure 1:
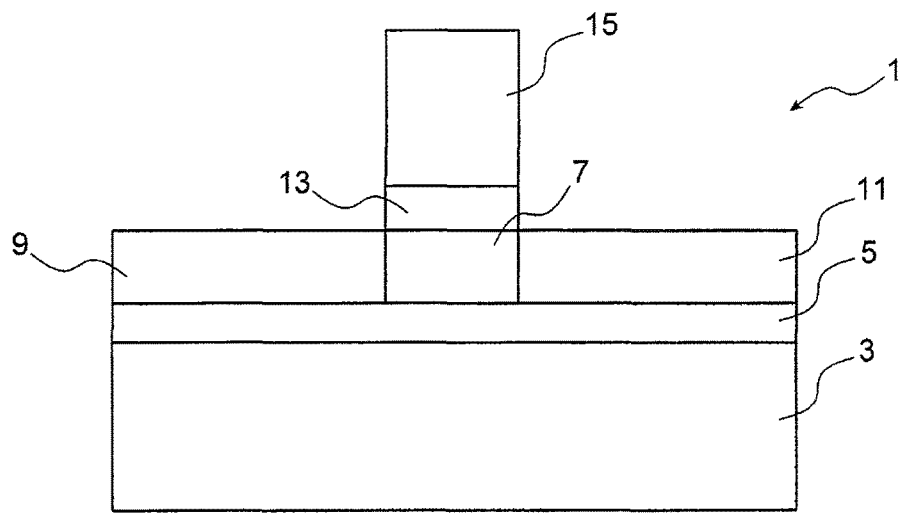

An example of an FDSOI transistor 1 is represented in FIG. 1.

Transistor 1 is produced on a substrate of the SOI type including a semiconductor supporting layer, or substrate, 3, where the semiconductor may for example be silicon, on which are positioned a dielectric layer 5, for example comprising $SiO_2$, forming a buried dielectric (BOX), and a layer of semiconductor, such as silicon, in which a channel area 7 and source 9 and drain 11 areas are formed, covering buried dielectric layer 5. Channel 7 is covered by a gate dielectric 13, for example comprising $SiO_2$, on which a gate 15, for example comprising TiN, is positioned.

The electrical performance of such an FDSOI-type transistor 1 depends on the quality of its silicium/$SiO_2$ interfaces, i.e. the interface between the portion of silicon intended to form channel 7 and gate dielectric 13, called the front interface, and the interface between the portion of silicon intended to form channel 7 and buried dielectric 5, called the back interface.

To assess the electrical performance of this transistor 1 the defect densities must be able to be measured and quantified at these front ($D_{it1}$) and back ($D_{it2}$) interfaces.

Document EP 2 290 386 A1 describes a method for assessing the electrical performance of such a FDSOI transistor, by means of a quantification of defect densities $D_{it1}$ and $D_{it2}$.

The electrical performance of an FDSOI transistor deteriorates over time as it is used; this deterioration leads to an increase of the transistor's defect densities $D_{it1}$ and $D_{it2}$. Although the method described by EP 2 290 386 A1 is effective in terms of the assessment made of the transistor's electrical performance, and could therefore be used to monitor changes in this performance over time, it is complex to implement, notably due to the complex model used to describe the electrical response of the transistor's interface states.

DESCRIPTION OF THE INVENTION

Thus there is a need to propose a method of measuring changes over time of the electrical performance of an FDSOI transistor which is less complex to implement.

To this end, one embodiment proposes a method of measuring the changes of the electrical performance of an FDSOI transistor positioned on a semiconductor substrate, between a first state and a second state of the transistor after an operating period $t_1$, including at least the following steps:

measurement of the transistor's capacities $C_1$ and $C_2$ respectively in the first and second states, by applying a voltage $V_{BG}>0$ to the substrate when the transistor is of the NMOS type, or a voltage $V_{BG}<0$ to the substrate when the transistor is of the PMOS type, according to a voltage $V_{FG}$ applied between a gate and source and drain areas of the transistor, determination, in relation to characteristic $C_1(V_{FG})$ measured varying between a maximum value $C_{max}$ and a minimum value $C_{min}$, and including three consecutive inflection points, of an ordinate value $C_{plat}$ of $C_1(V_{FG})$ at the second of the three inflection points of $C_1(V_{FG})$, and of two abscissa values $V_{Upper(0)}$ and $V_{Lower(0)}$ of $C_1(V_{FG})$ such that $V_{Upper(0)}=C_1^{-1}((C_{max}+C_{plat})/2)$ and $V_{Lower(0)}=C_1^{-1}((C_{min}+C_{plat})/2)$, determination, from characteristic $C_2(V_{FG})$, of two abscissa values $V_{Upper(t1)}$ and $V_{Lower(t1)}$ of $C_2(V_{FG})$ such that $V_{Upper(t1)}=C_2^{-1}((C_{max}+C_{plat})/2)$ and $V_{Lower(t1)}=C_2^{-1}((C_{min}+C_{plat})/2)$, determination of variations of defect densities $\Delta D_{it1}$, $\Delta D_{it2}$ between the transistor's first and second states, respectively at an interface between a gate dielectric of the transistor and a channel area of the transistor, and an interface between the channel area and a buried dielectric of the transistor, from values $\Delta V_{Upper(t1)} = V_{Upper(t1)} - V_{Upper(0)}$ and $\Delta V_{Lower(t1)} = V_{Lower(t1)} - V_{Lower(0)}$.

Ordinate value $C_{plat}$ of $C_1(V_{FG})$ can be determined by considering a portion of the transistor's characteristic $C_1(V_{FG})$ varying between maximum value $C_{max}$ and minimum value $C_{min}$ with a gradient of constant sign, and including at least the three consecutive inflection points.

Use of this method enables the deterioration over time of the transistor's electrical performance to be assessed through the assessment of the deterioration over time of the quality of the transistor's semiconductor/dielectric interfaces (i.e. by determining whether defect densities $D_{it1}$, $D_{it2}$ have changed over time in the transistor's semiconductor/gate dielectric front interface and/or gate semiconductor/gate dielectric back interface), by locating a possible variation of the number of defects created in the transistor's front interface and/or back interface, and possibly in quantifying these variations of the transistor's defect densities $\Delta D_{it1}$, $\Delta D_{it2}$ over operating period $t_1$ in this or these front and back interfaces.

Compared to use of the method described in EP 2 290 386 A1 to measure the transistor's defect densities $D_{it1}$ and $D_{it2}$ in the first state, and then in the second state, after an operating period $t_1$, this method requires no complex modelling of the transistor, thus reducing the computations to be made.

In addition, with this method, a single measurement of the transistor's capacities in the first and the second states is made.

This method can be used both for NMOS-type FDSOI and PMOS-type FDSOI transistors.

The value of $\Delta D_{it1}$ may be calculated using the following equation:

$$\Delta Dit_1 = \frac{\varepsilon_{ox}}{q \cdot EOT} \Delta V_{Upper}$$

where $\epsilon_{ox}$: dielectric constant of the material of the transistor's gate dielectric, EOT: equivalent oxide thickness of the gate dielectric, q: elementary charge (q=1.6×10$^{-19}$ C).

The value of $\Delta D_{it2}$ may be determined at least by using the following steps:

calculation of the transistor's characteristics $C(V_{FG})$ for different theoretical values of $\Delta D_{it2}$, calculation of the relation $\Delta V_{Lower}=f(\Delta D_{it2})$ from previously calculated characteristics $C(V_{FG})$, calculation of value $\Delta D_{it2}=f^{-1}(\Delta V_{Upper(t1)}-\Delta V_{Lower(t1)})$.

The transistor's characteristics $C(V_{FG})$ for different theoretical values of $\Delta D_{it2}$ may be calculated by a Poisson-Schrödinger solver-type application from the values of the thickness of the semiconductor intended to form the transistor's channel, of the equivalent oxide thickness EOT of the transistor's gate dielectric, of voltages $V_{BG}$ and $V_{FG}$ applied to the transistor, of the thickness of the transistor's buried dielectric, and of the temperature of the environment in which the transistor is operating.

As a variant, the value of $\Delta D_{it2}$ may be determined by the following equation:

$$\Delta D_{it2} = \frac{\Delta V_{Lower}}{(\alpha \cdot t_{Si} + \beta \cdot EOT)}$$

Where $\alpha=1.25\times10^{-4}$ mV·cm, and $\beta=4.5\times10^{-4}$ mV·cm,

EOT: equivalent oxide thickness of the gate dielectric, $t_{Si}$: thickness of the semiconductor intended to form the transistor's channel.

In another variant, the value of $\Delta D_{it2}$ may be determined from a relation $\Delta V_{Lower}=f(\Delta D_{it2})$ which is known for the transistor (for example by using an abacus for the type of transistor under study), by calculating value $\Delta D_{it2}=f^{-1}(\Delta V_{Upper(t1)}-\Delta V_{Lower(t1)})$.

Voltage $V_{FG}$ may include a direct current component, the value of which is between approximately −2 V and 2 V, and a sinusoid alternating component, the frequency of which may be between approximately 10 kHz and 100 kHz.

Voltage $V_{BG}$ may be a direct current voltage, the value of which may be between approximately 5 V and 10 V when the transistor is of the NMOS type, or between approximately −5 V and −10 V when the transistor is of the PMOS type.

The transistor's capacity C may be measured by an impedance analyser.

Another embodiment relates to a device for measuring the changes of the electrical performance of an FDSOI transistor, including means for implementing a method for measuring changes of the electrical performance of the FDSOI transistor as described above.

BRIEF DESCRIPTION OF THE ILLUSTRATIONS

Figure 2:
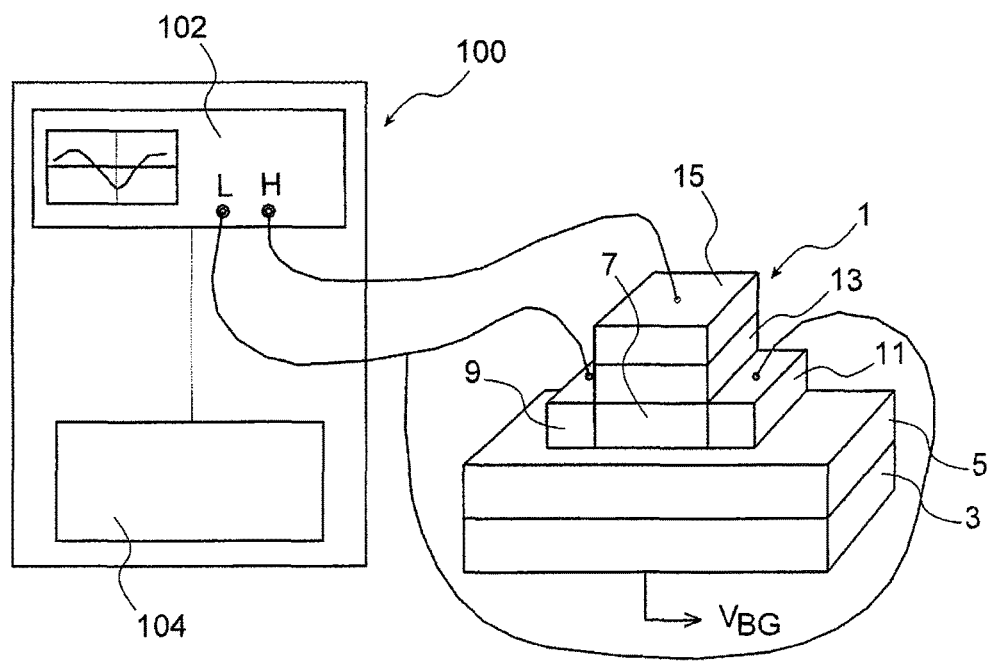
Figure 3A:
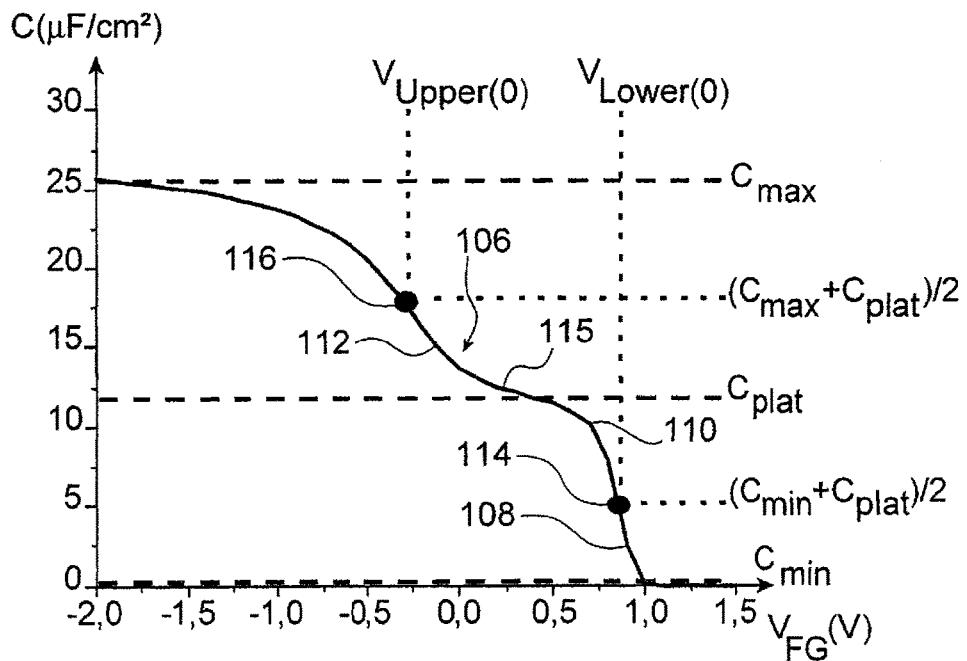
Figure 3B:
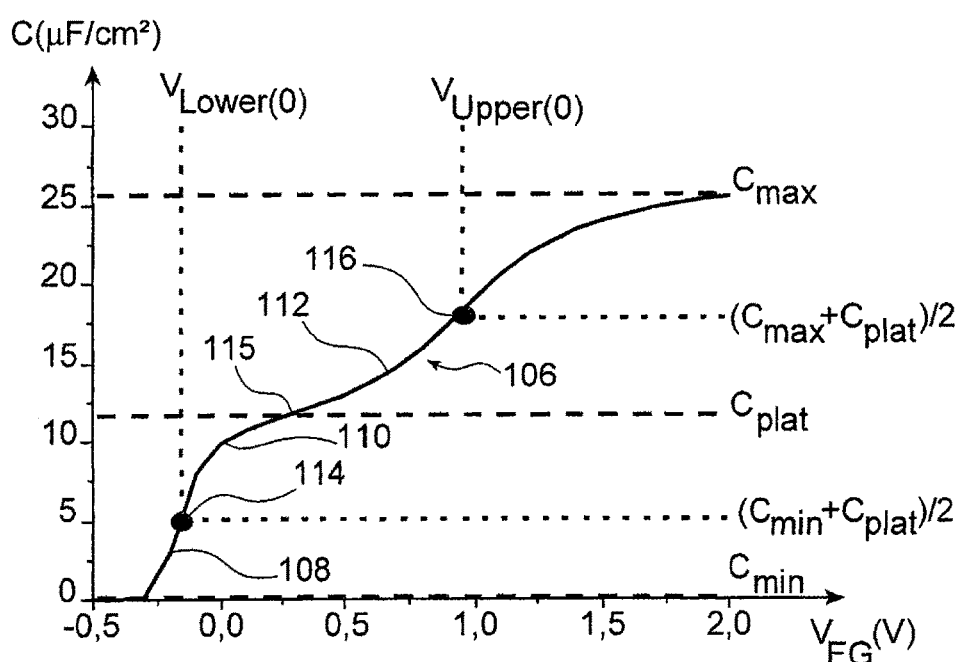

The present invention will be better understood on reading the description of example embodiments given purely as an indication and in no way restrictively, making reference to the appended illustrations in which:

FIG. 1 represents a transistor of the FDSOI type,

FIG. 2 represents an example embodiment of a device for measuring changes of the electrical performance of an FDSOI transistor, FIGS. 3A and 3B represent measurements of a characteristic $C(V_{FG})$ of an FDSOI transistor produced during a method for measuring changes of the electrical performance of an FDSOI transistor, FIGS. 4 to 12 represent different measurement and calculation curves plotted during use of a method for measuring changes of the electrical performance of an FDSOI transistor.

Identical, similar or equivalent portions of the various figures described below have the same numerical references, to make it easier to move from one figure to another.

The various portions represented in the figures are not necessarily represented at a uniform scale, in order to make the figures more readable.

The various possibilities (variants and embodiments) must be understood as not being mutually exclusive, and being able to be combined with one another.

DETAILED ACCOUNT OF PARTICULAR EMBODIMENTS

A method for measuring changes in the electrical performance of an FDSOI transistor, corresponding for example to FDSOI transistor 1 previously described in connection with FIG. 1, and which may be of the NMOS or PMOS type, is described below, enabling changes over time of the defect densities present at the front interface between gate dielectric 13 and the semiconductor of channel 7 ($D_{it1}$) and at the back interface between the semiconductor of channel 7 and buried dielectric 5 ($D_{it2}$) to be characterised.

This characterisation consists in locating the deterioration incurred by transistor 1, i.e. in determining whether additional defects have been generated at the dielectric/semiconductor front interface and/or back interface of transistor 1, and possibly in then calculating the quantities of defects $\Delta D_{it1}$ and/or $\Delta D_{it2}$ created over time by the operation of transistor 1 at these interfaces.

$\Delta D_{it1}$ is defined as being the difference between defect density $D_{it1}(0)$ at the front interface of transistor 1 in a first state, corresponding for example to the initial state of transistor 1 (i.e. the state of transistor 1 when it has never been used) and defect density $D_{it1}(t_1)$ at the front interface of transistor 1 in a second state, i.e. its state after an operating period $t_1$ since the first state, corresponding to ageing due to use during time period $t_1$, such that:

$$\Delta D_{it1}=D_{it1}(t_1)-D_{it1}(0) \quad (1)$$

Similarly, $\Delta D_{it2}$ is defined as being the difference between defect density $D_{it2}(0)$ at the back interface of transistor 1 in its first state, corresponding for example to the initial state of transistor 1 (i.e. the state of transistor 1 when it has never been used) and defect density $D_{it1}(t_1)$ at the back interface of transistor 1 in its second state, i.e. its state after an operating period $t_1$ since the first state, corresponding to ageing due to use during time period $t_1$, such that:

$$\Delta D_{it2}=D_{it2}(t_1)-D_{it2}(0) \quad (2)$$

This method is implemented by a device 100 for measuring the changes of the electrical performance of FDSOI transistor 1, represented in FIG. 2. Device 100 includes an impedance analyser 102, for example of the Agilent HP4184 type or equivalent, the High input of which is connected to gate 15, and the Low input of which is connected to source 9 and to drain 11 of transistor 1, together with calculation means 104 able to determine different values which will be described below. Calculation means 104 may notably include a computer.

In a first step of the method for measuring changes of the electrical performance of transistor 1, the capacity of transistor 1 is measured according to the value of a voltage $V_{FG}$ applied to gate 15, with a voltage $V_{BG}$ applied to the back face of transistor 1, i.e. to substrate 3. Voltage $V_{BG}$ is greater than 0 when transistor 1 is of the NMOS type, and is less than 0 when transistor 1 is of the PMOS type. In physical terms, this amounts in transistor 1 to separating the inversion of the channel in the front and back interfaces, i.e. in decorrelating the electrical response of the defects present in the front interface of transistor 1 in relation to that of the defects present in the back interface of transistor 1.

This measurement of capacity C of transistor 1 is made by electrically connecting source 9 to drain 11, applying voltage $V_{FG}$ between gate 15 and source 9, or between gate 15 and drain 11, and by applying voltage $V_{BG}$ to substrate 3 through a voltage source. This measurement of capacity C is made by impedance analyser 102.

The values of voltages $V_{FG}$ and $V_{BG}$ are chosen so as to obtain a curve $C(V_{FG})$ including at least one portion which varies between a maximum value $C_{max}$ and a minimum value $C_{min}$ with a gradient of constant sign (positive or negative depending on whether transistor 1 is of the PMOS or NMOS type) and including three consecutive inflection points. Voltage $V_{FG}$ includes a direct current component, the value of which is made to vary, for example between approximately −2 V and +2 V, to make the measurement of capacity C of transistor 1, together with an alternating component of amplitude of, for example, between approximately 30 mV and 40 mV, and of frequency of, for example, between approximately 10 kHz and 100 kHz (in this case set at 100 kHz). $V_{BG}$ may typically be set so as to obtain an electric field $E_{ox}=V_{BG}/T_{ox}$ in buried dielectric 5 of between approximately 1 MV/cm and 4 MV/cm, where $T_{ox}$ is the thickness of buried dielectric 5. Thus, for a PMOS-type transistor 1 including a portion of silicon forming a channel 7 of thickness equal to approximately 7 nm, a buried dielectric 5 of thickness equal to approximately 25 nm and a gate dielectric 13 having an equivalent oxide thickness EOT of approximately 1.2 nm, $V_{BG}$ may be chosen independently within interval [−5 V, −10 V].

Curve 106 represented in FIG. 3A is the measurement made of capacity C of transistor 1 as a function of voltage $V_{FG}$ (where C is expressed in $\mu F/cm^2$, and $V_{FG}$ is expressed in Volts) of transistor 1 in its first state, i.e. the defect densities of which at its front and back interfaces are $D_{it1}(0)$ and $D_{it2}(0)$, with $V_{FG}$ varying between 1.5 V and −2V. This curve 106 is called characteristic $C_1(V_{FG})$ of transistor 1.

By considering the variation of the value of C between $V_{FG}=1.5$ V and $V_{FG}=-2$ V (reading of curve 106 represented in FIG. 3A from right to left), it can be seen that curve 106 changes from minimum value $C_{min}$ at $V_{FG}$ equal to approximately 1.25 V, to maximum value $C_{max}$ at $V_{FG}$ equal to approximately −2 V, with a positive gradient. In this curve 106 a first rise can be observed (referenced 108 in FIG. 3A) of the value of C with $V_{FG}$ varying from approximately 1.25 V to 0.75 V. This first increase of the value of C corresponds to an accumulation occurring solely in the back interface of transistor 1, since the front interface of transistor 1 is depleted. With $V_{FG}$ varying between approximately 0.75 V and 0.25 V, the gradient of curve 106 declines, where this portion (referenced 110 in FIG. 3A) of curve 106 forms a "plateau", or transition phase. Curve 106 then includes a second rise (referenced 112 in FIG. 3A) of the value of C with $V_{FG}$ varying between approximately 0.25 V and −2 V (with an increase of the gradient of curve 106 relative to portion 110), which this time corresponds to an accumulation occurring at the front interface of transistor 1, where the back interface is still accumulated, until the value of C reaches maximum value $C_{max}$.

This curve 106 varies between a maximum value $C_{max}$ and a minimum value $C_{min}$ with a gradient of constant sign, and includes three consecutive inflection points, referenced 114, 115 and 116, and which are located respectively in portions 108, 110 and 112. Second inflection point 115 is located in "plateau" portion 110 of curve 106.

A value $C_{plat}$ is defined as being the value of C at second inflection point 115, in the middle of "plateau" portion 110. Abscissa values $V_{Lower(0)}$ and $V_{Upper(0)}$ of characteristic $C_1(V_{FG})$ are then defined as being the values of $V_{FG}$ at values $(C_{min}+C_{plat})/2$ and $(C_{max}+C_{plat})/2$, which correspond approximately to the values of $V_{FG}$ at first inflection point 114 and at second inflection point 116. We therefore have:

$$V_{Upper(0)}=C_1^{-1}((C_{max}+C_{plat})/2) \qquad (3)$$

$$V_{Lower(0)}=C_1^{-1}((C_{min}+C_{plat})/2) \qquad (4)$$

In the case of an NMOS-type transistor, an identical analysis of characteristic $C_1(V_{FG})$ would be made by reading the corresponding curve from left to right, for example by considering the variation of the value of C between −0.5 V and 2 V, as represented in FIG. 3B. $V_{BG}$ is in this case positive. In this case the curve has a gradient of positive sign when considering the change of the value of C from $V_{FG}=1.25$ V to $V_{FG}=2$ V.

Values $V_{Upper(0)}$ and $V_{Lower(0)}$ are, for example, calculated by calculation means 104 from data supplied by impedance analyser 102.

A similar measurement of capacity C is then made according to voltage $V_{FG}$ of the same FDSOI transistor 1, but in its second state, i.e. after a certain operating period $t_1$. The defect densities at its front and back interfaces are called $D_{it1}(t_1)$ and $D_{it2}(t_1)$. The value of $V_{BG}$ and the range of values of $V_{FG}$ applied to transistor 1 during this measurement are similar to those applied during the previous measurement of characteristic $C_1(V_{FG})$. This measurement enables characteristic $C_2(V_{FG})$ of transistor 1 to be obtained.

Figure 4:
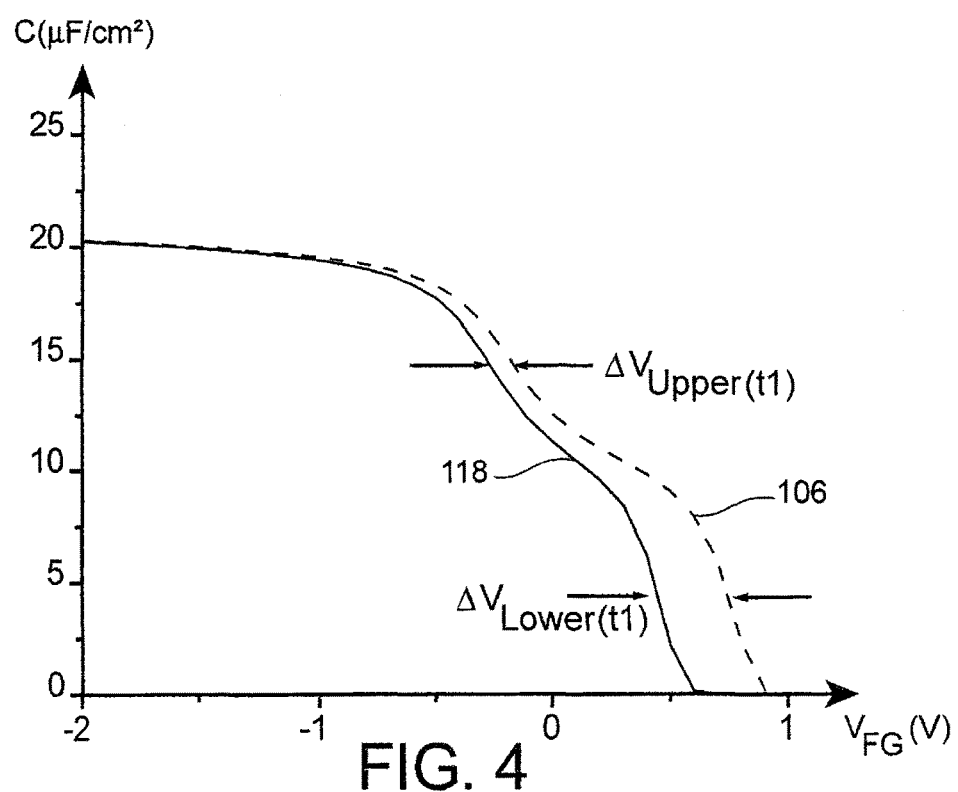
Figure 5:
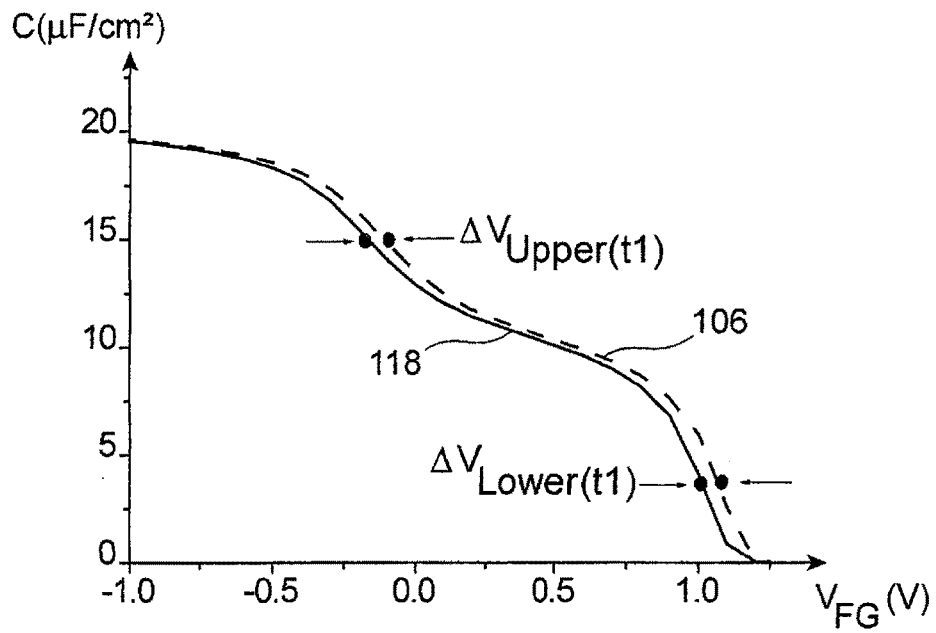
Figure 6:
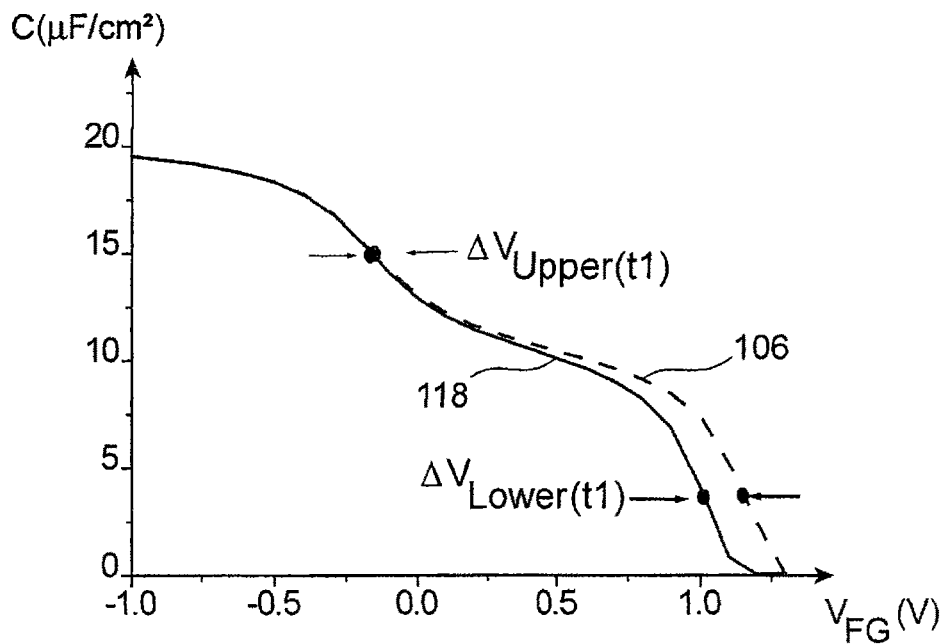

Characteristics $C_1(V_{FG})$ and $C_2(V_{FG})$ obtained are then compared to one another (see FIG. 4: curve 106 corresponds to characteristic $C_1(V_{FG})$ of transistor 1 in its first state, and curve 118 corresponds to characteristic $C_2(V_{FG})$ of transistor 1 in its second state, i.e. after a period of use $t_1$). In a manner comparable to the calculation of values $V_{Upper(0)}$ and $V_{Lower(0)}$ made previously from characteristic $C_1(V_{FG})$, values $V_{Upper(t1)}$ and $V_{Lower(t1)}$ are calculated from characteristic $C_2(V_{FG})$ such that:

$$V_{Upper(t1)}=C_2^{-1}((C_{max}+C_{plat})/2) \qquad (5)$$

$$V_{Lower(t1)}=C_2^{-1}((C_{min}+C_{plat})/2) \qquad (6)$$

Values $V_{Upper(t1)}$ and $V_{Lower(t1)}$ can be calculated from values $C_{min}$, $C_{plat}$ and $C_{max}$ which were previously determined from $C_1(V_{FG})$. It is also possible to recalculate $C_{min}$, $C_{plat}$ and $C_{max}$ from $C_2(V_{FG})$ if differences of value are observed between those of $C_1(V_{FG})$ and those of $C_2(V_{FG})$.

It is then possible to calculate, in analytical fashion from values $V_{Upper(t1)}$, $V_{Upper(0)}$, $V_{Lower(t1)}$ and $V_{Lower(0)}$, or in graphical fashion from plotted curves 106 and 118, the variations of values $V_{Upper}$ and $V_{Lower}$ between the transistor's first and second states, such that:

$$\Delta V_{Upper(t1)}=V_{Upper(t1)}-V_{Upper(0)} \qquad (7)$$

$$\Delta V_{Lower(t1)}=V_{Lower(t1)}-V_{Lower(0)} \qquad (8)$$

From these values $\Delta V_{Upper(t1)}$ and $\Delta V_{Lower(t1)}$, it is then possible to locate the deterioration incurred by transistor FDSOI 1, i.e. to determine whether additional defects have been produced at the dielectric/semiconductor front interface and/or back interface of transistor 1.

In a first case, if $\Delta V_{Upper(t1)} \approx \Delta V_{Lower(t1)}$, this means that defects have been created only in the front interface of transistor 1 (which reflects the fact that $|\Delta D_{it1}| > 0$ and $\Delta D_{it2} \approx 0$). This case corresponds to characteristics $C_1(V_{FG})$ and $C_2(V_{FG})$, referenced respectively 106 and 118, represented in FIG. 5. It can be seen in this figure that characteristic $C_2(V_{FG})$ 118 of transistor 1 obtained after a period of use $t_1$ of the transistor is offset by a constant value in parallel to the axis of the abscissae, compared to the transistor's characteristic $C_1(V_{FG})$ 106 in its first state.

In a second case, if $\Delta V_{Upper(t1)} \approx 0$ and $\Delta V_{Lower} > 0$, this means that defects have been created only on the back interface of transistor 1 (which reflects the fact that $|\Delta D_{it2}| > 0$ and $\Delta D_{it1} \approx 0$). This case corresponds to characteristics $C_1(V_{FG})$ 106 and $C_2(V_{FG})$ 118 represented in FIG. 6. This dissymmetry between $\Delta V_{Upper(t1)}$ and $\Delta V_{Lower(t1)}$ is explained by a physical phenomenon of screening of the charges at the back interface by free carriers (holes) accumulated in the silicon layer when $-2 \text{ V} < V_{FG} < 0.2 \text{ V}$. This screening does not occur when $0.2 \text{ V} < V_{FG} < 1 \text{ V}$, when the majority of the silicon layer is depleted.

Finally, in a third case, if $\Delta V_{Upper(t1)} \neq 0$ and $|\Delta V_{Upper(t1)}| < |\Delta V_{Lower(t1)}|$, this means that defects have been created at both front and back interfaces of transistor 1 (which reflects the fact that $|\Delta D_{it1}| > 0$ and $|\Delta D_{it2}| > 0$). This case corresponds to characteristics $C_1(V_{FG})$ 106 and $C_2(V_{FG})$ 118 represented in FIG. 4.

Thus, depending on the values of $\Delta V_{Upper(t1)}$ and $\Delta V_{Lower(t1)}$, the defects created at one or both of the semiconductor/dielectric interfaces of an FDSOI transistor can be located after the transistor has been used.

From the measurements and calculations previously made to locate the created defects, quantities $\Delta D_{it1}$ and $\Delta D_{it2}$ of defects generated by the use of transistor 1 during operating period $t_1$ can be calculated.

Thus, when $\Delta V_{Upper(t1)} \neq 0$ (first and third cases described above), the value of $\Delta D_{it1}$ is calculated from the following formula:

$$\Delta Dit_1 = \frac{\varepsilon_{ox}}{q \cdot EOT} \Delta V_{Upper} \tag{9}$$

where $\varepsilon_{ox}$: dielectric constant of the material of gate dielectric 13 (equal to $3.45 \times 10^{-11}$ F/m² for $SiO_2$), EOT: equivalent oxide thickness of gate dielectric 13, q: elementary charge.

Figure 7:
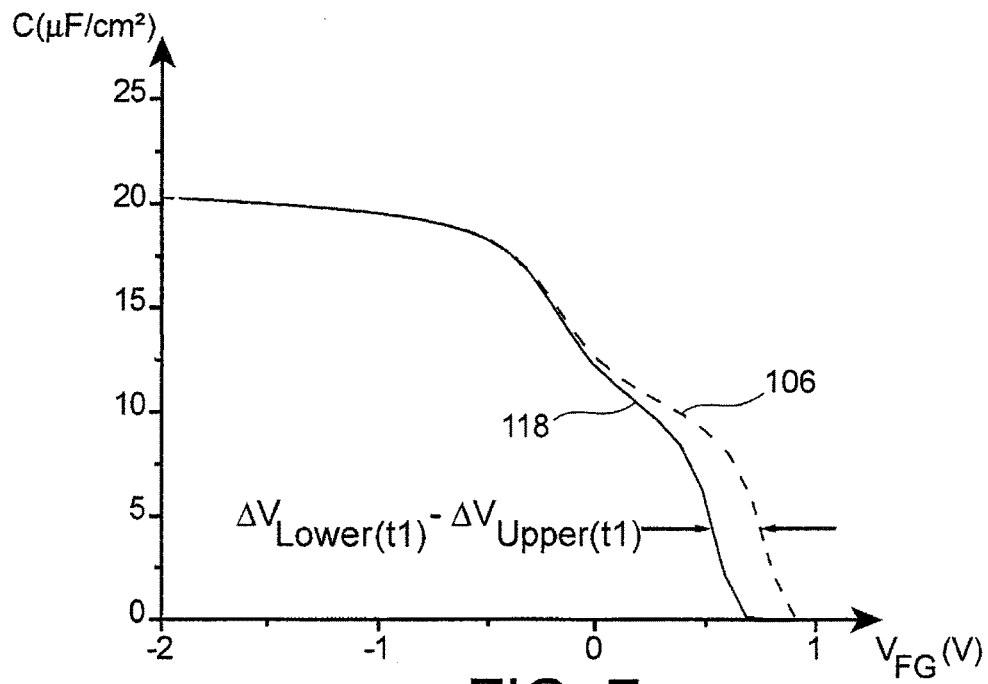

To calculate $\Delta D_{it2}$, previously obtained curve 106 (corresponding to characteristic $C_1(V_{FG})$ of transistor 1 in its first state) and another curve, referenced 120 in FIG. 7, representing the values of the transistor's capacity C in its second state, but depending on $V_{FG} - \Delta V_{Upper(t1)}$, are first plotted in the same graph. Curve 120 therefore corresponds to characteristic $C_2(V_{FG})$ (curve 118) offset, in parallel with the axis of the abscissae, by the value of $\Delta V_{Upper(t1)}$. At value $C = (C_{max} + C_{plat})/2$, the offset between curves 106 and 120 is therefore zero. At value $C = (C_{min} + C_{plat})/2$, the offset between curves 106 and 120 is therefore equal to $\Delta V_{Lower(t1)} - \Delta V_{Upper(t1)}$. This offset $\Delta V_{Lower(t1)} - \Delta V_{Upper(t1)}$ is related solely to the creation of defects at the back interface, i.e. to variation $\Delta D_{it2}$, given that offset $\Delta V_{Upper(t1)}$ is caused only by $\Delta D_{it1}$.

However, value $\Delta V_{Lower(t1)} - \Delta V_{Upper(t1)}$ can be calculated directly from previously calculated values $\Delta V_{Lower(t1)}$ and $\Delta V_{Upper(t1)}$, without having to plot the curves represented in FIG. 7.

An application of the Poisson-Schrödinger solver type, for example the SCHRED software, is then used, enabling the Poisson equation to be resolved in an SOI-type structure in accordance with the parameters of the structure and the measuring conditions, such that:

$$\Delta V = -\frac{\rho}{\varepsilon} \tag{10}$$

The input parameters of this application are: thickness $t_{Si}$ of the portion of silicon forming channel 7 of transistor 1, equivalent oxide thickness EOT of gate dielectric 13 of transistor 1 (where the calculation of the EOT of a transistor is described, for example, in document EP 1 591 558), the thickness of buried dielectric 5 $t_{Box}$, the values of voltages $V_{BG}$ and $V_{FG}$, the transistor's operating temperature and a value of back interface states density $D_{it2}$.

Equation (10) is firstly resolved, for an applied voltage $V_{FG}$ which is constant over time (pulse $\omega$ of the sinusoid alternating component of $V_{FG}$ is in this case zero), and a constant value of interface states density $D_{it2}$.

From these input parameters, the application can then calculate the concentration of electrons $n(x)$ and of holes $p(x)$ and the potential $\psi(x)$ at depth x in the portion of silicon intended to form the channel, where this depth is between 0 and $T_{Si}$.

It is then possible to calculate the integrated charges of holes $Q_h$ and electrons $Q_e$ given respectively by the following equations:

$$Q_h = e \int_0^{Tsi} p(x) dx \tag{11}$$

$$Q_e = e \int_0^{Tsi} n(x) dx \tag{12}$$

Total charge $Q_{tot}$ in the portion of silicon is then equal to:

$$Q_{tot} = Q_{dep} + Q_h + Q_e + eD_{it2} \tag{13}$$

where e is the elementary electrical charge of an election and $Q_{dep}$ the depletion charge equal to $e \cdot N_{dop} T_{si}$, and where $N_{dop}$ is the dopant concentration.

By repeating this resolution for different voltage values $V_{FG}$ and for the same fixed value of $D_{it2}$, capacity $C(V_{FG})$ is obtained by simple derivation with respect to voltage $V_{FG}$:

$$C(V_{FG}) = -\frac{dQ_{tot}}{dV_{FG}} \tag{14}$$

Figure 8:
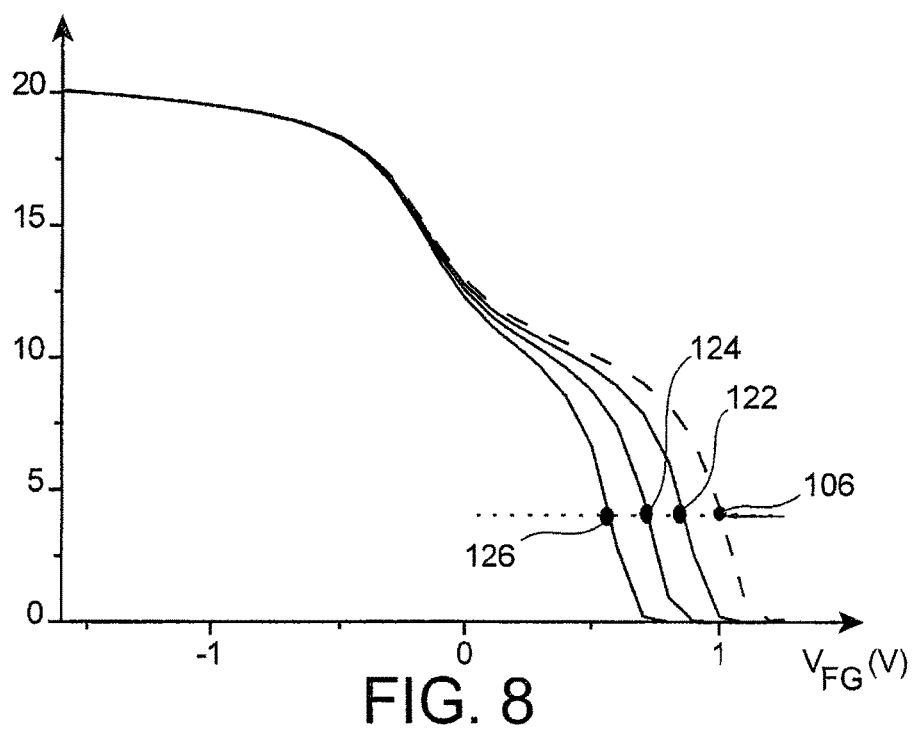

Finally, by resolving this equation for different theoretical values of $\Delta D_{it2}$, the transistor's characteristic $C(V_{FG})$ for the different values of $\Delta D_{it2}$ is obtained (see curves 106, 122, 124 and 126 represented in FIG. 8, corresponding to characteristics $C(V_{FG})$ of transistor 1 respectively for the theoretical values of $\Delta D_{it2}$ equal to 0, $1 \times 10^{12}$, $2 \times 10^{12}$ and $3 \times 10^{12}$ cm$^{-2}$). By measuring the differences $\Delta V_{Lower}$ between characteristic $C(V_{FG})$ of transistor 1 in its first state (corresponding to curve 106 represented in FIG. 8, and which corresponds to $\Delta D_{it2}=0$) and each of the previously calculated characteristics $C(V_{FG})$, i.e. the differences of the abscissa values between characteristic $C(V_{FG})$ of transistor 1 in its first state and each of the other calculated characteristics $C(V_{FG})$, at ordinate value $(C_{min}+C_{plat})/2$, the relation between $\Delta V_{Lower}$ and $\Delta D_{it2}$ can be determined (see FIG. 9, in which relation $\Delta V_{Lower}$ is represented, in mV, as a function of $\Delta D_{it2}$/in cm$^{-2}$, for the following parameters: $t_{Si}=7$ nm; $t_{Box}=25$ nm; EOT=1.2 nm). This relation can be obtained by choosing several values, for example ten, of $\Delta D_{it2}$ within the range $[10^{10}$ cm$^{-2}$; $5 \times 10^{12}$ cm$^{-2}]$.

Figure 9:
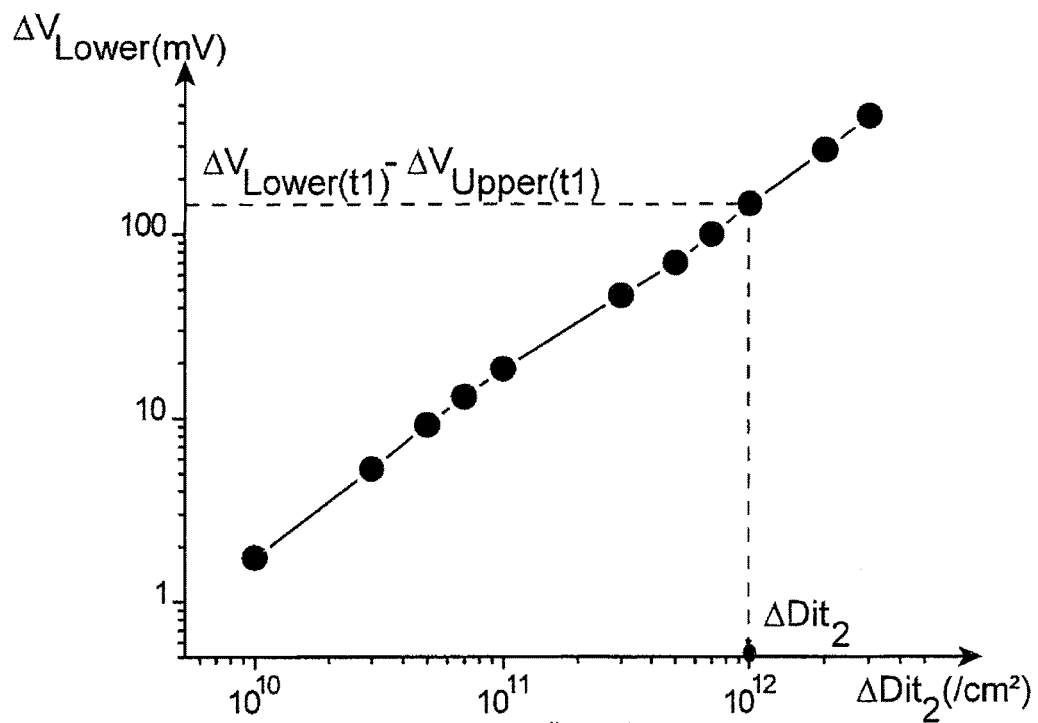

By then plotting previously calculated value $\Delta V_{Lower(t1)} - \Delta V_{Upper(t1)}$ on the curve representing the relation $\Delta V_{Lower}=f(\Delta D_{it2})$ represented in FIG. 9, a precise value of $\Delta D_{it2}$ is obtained for transistor 1 representing the variation, after an operating period of the defects density at the back interface of transistor 1. We therefore have:

$$\Delta D_{it2}=f^{-1}(\Delta V_{Upper(t1)}-\Delta V_{Lower(t1)}) \quad (15)$$

Figure 10:
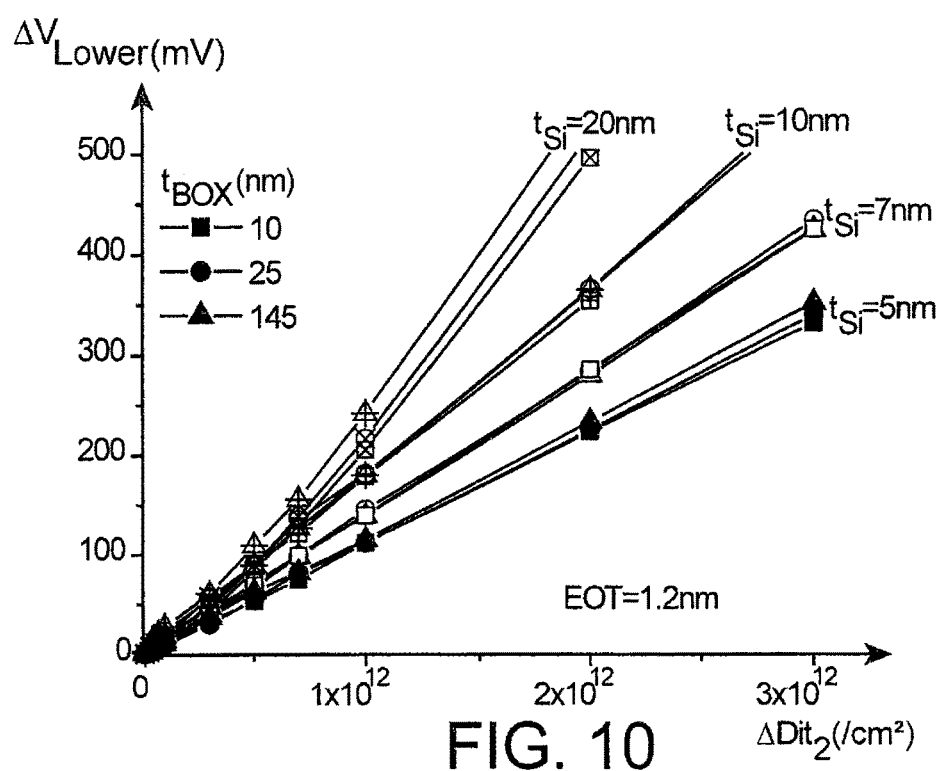
Figure 11:
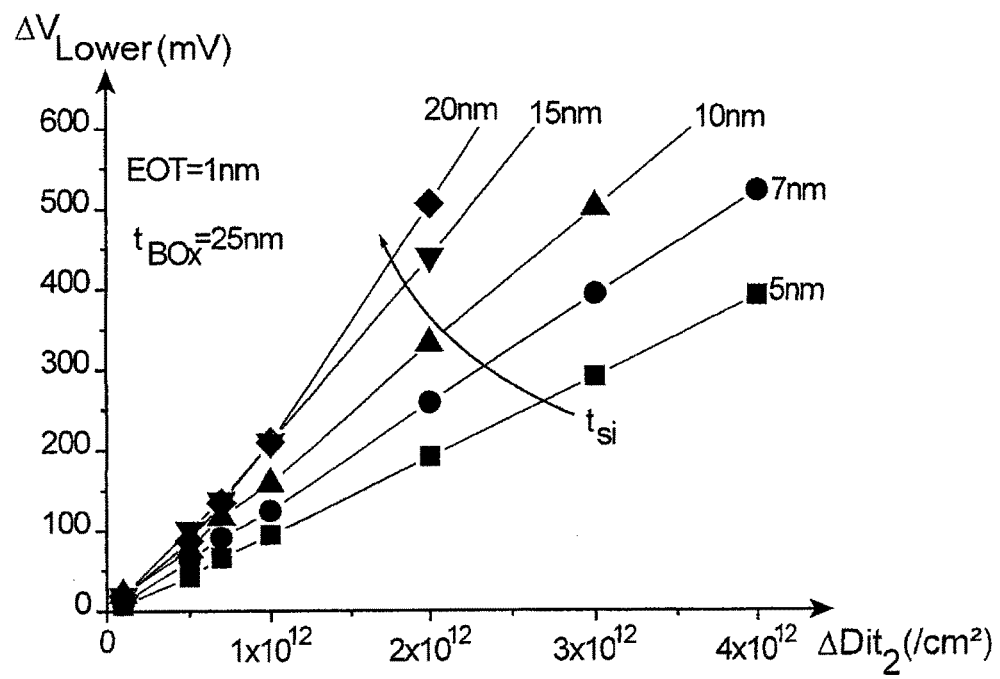
Figure 12:
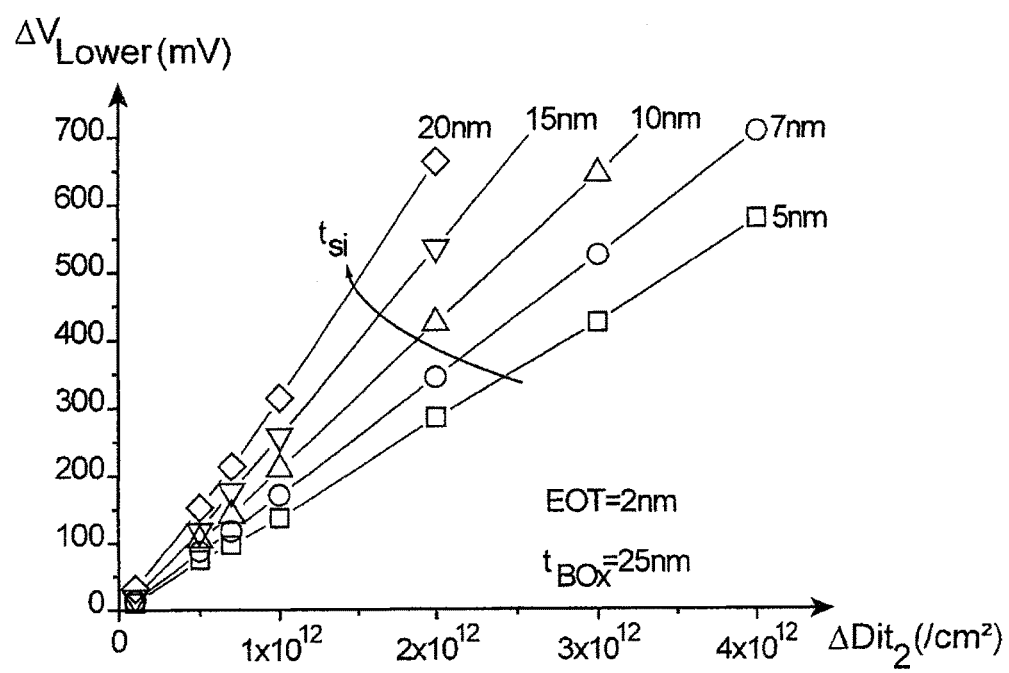

To avoid having to implement the calculation steps enabling the relation $\Delta V_{Lower}=f(\Delta D_{it2})$ to be determined each time this method is used, abacuses $\Delta V_{Lower}=f(\Delta D_{it2})$ can be used for habitual values of $t_{Si}$, $t_{Box}$ and EOT of different FDSOI transistors. Examples of $V_{Lower}=f(\Delta D_{it2})$ abacuses for different values of $t_{Si}$, $t_{Box}$ and EOT are represented in FIGS. 10, 11 and 12:

FIG. 10: $\Delta V_{Lower}=f(\Delta D_{it2})$ for different values of $t_{Si}$ (5 nm, 7 nm, 10 nm and 20 nm), EOT=1.2 nm, and $t_{Box}=10$ nm or 25 nm or 145 nm, FIG. 11: $\Delta V_{Lower}=f(\Delta D_{it2})$ for different values of $t_{Si}$ (5 nm, 7 nm, 10 nm, 15 nm and 20 nm), EOT=1 nm, and $t_{Box}=25$ nm, FIG. 12: $\Delta V_{Lower}=f(\Delta D_{it2})$ for different values of $t_{Si}$ (5 nm, 7 nm, 10 nm, 15 nm and 20 nm), EOT=2 nm, and $t_{Box}=25$ nm.

As a variant, the value of $\Delta D_{it2}$ can be calculated from the following relation:

$$\Delta V_{Lower}=(\alpha \cdot t_{Si}+\beta \cdot EOT)\Delta D_{it2} \quad (16)$$

Where $\alpha=1.25 \times 10^{-4}$ mV·cm$^{-3}$, and $\beta=4.5 \times 10^{-4}$ mV·cm$^{-3}$.

In the method described above, the change over time of the electrical performance of FDSOI transistor 1 between its initial state, i.e. when it has never operated, and a second state of this transistor after an operating period $t_1$, has been measured. This method can also be used to assess the change over time of the electrical performance of an FDSOI transistor between a first state of the transistor, corresponding to its state after an operating period $t_2$, and a second state of this same transistor after an operating period $t_3$, where $t_3 > t_2$.

The invention claimed is:

1. A method of measuring the changes of the electrical performance of an FDSOI transistor positioned on a semiconductor substrate, between a first state and a second state of the transistor, after an operating period $t_1$, including at least the following steps:

using a capacitance measuring device to measure the transistor's capacitance $C_1$ and $C_2$ respectively in the first and second states, by:

applying a voltage $V_{BG}>0$ to the substrate when the transistor is of the NMOS type, or a voltage $V_{BG}<0$ to the substrate when the transistor is of the PMOS type, wherein application of $V_{BG}$ to the substrate decorrelates the electrical response of defects present in a front interface of the transistor in relation to the electrical response of defects present in a back interface of the transistor and voltage $V_{BG}$ is a direct current voltage, the value of which is between approximately 5 V and 10 V when the transistor is of the NMOS type, or between approximately −5 V and −10 V when the transistor is of the PMOS type, and connecting a first lead of the capacitance measuring device to a gate of the transistor, and connecting a second lead of the capacitance measuring device to the source and drain area of the transistor, such that a voltage $V_{FG}$ from the capacitance measuring device is applied between the gate, and the source and drain areas of the transistor;

determining, in relation to characteristic $C_1(V_{FG})$ measured varying between a maximum value $C_{max}$ and a minimum value $C_{min}$, and including three consecutive inflection points, of an ordinate value $C_{plat}$ of $C_1(V_{FG})$ at the second of the three inflection points of $C_1(V_{FG})$, and of two abscissa values $V_{Upper(0)}$ and $V_{Lower(0)}$ of $C_1(V_{FG})$ according to equations $V_{Upper(0)}=C_1^{-1}((C_{max}+C_{plat})/2)$ and $V_{Lower(0)}=C_1^{-1}((C_{min}+C_{plat})/2)$, determining, from characteristic $C_2(V_{FG})$, of two abscissa values $V_{Upper(t1)}$ and $V_{Lower(t1)}$ of $C_2(V_{FG})$ according to equations $V_{Upper(t1)}=C_2^{-1}((C_{max}+C_{plat})/2)$ and $V_{Lower(t1)}=C_2^{-1}((C_{min}+C_{plat})/2)$, and determining variations of defect densities $\Delta D_{it1}$, $\Delta D_{it2}$ between the transistor's first and second states, respectively at an interface between a gate dielectric of the transistor and a channel area of the transistor, and an interface between the channel area and a buried dielectric of the transistor, from values $\Delta V_{Upper(t1)}=V_{Upper(t1)}-V_{Upper(0)}$ and $\Delta V_{Lower(t1)}=V_{Lower(t1)}-V_{Lower(0)}$.

2. The method according to claim 1, in which the value of $\Delta D_{it1}$ is calculated according to the following equation:

$$\Delta Dit_1 = \frac{\varepsilon_{ox}}{q \cdot EOT}\Delta V_{Upper}$$

where $\varepsilon_{ox}$: dielectric constant of the material of the gate dielectric, EOT: equivalent oxide thickness of the gate dielectric, q: elementary charge.

3. The method according to claim 1, in which the value of $\Delta D_{it2}$ is determined at least by the implementation of the following steps:

calculating the characteristics $C(V_{FG})$ of the transistor for different theoretical values of $\Delta D_{it2}$, calculating the relation $\Delta V_{Lower}=f(\Delta D_{it2})$ from previously calculating value $\Delta D_{it2}=f^{-1}(\Delta V_{Upper(t1)}\cdot\Delta V_{Lower(t1)})$.

4. The method according to claim 3, in which the characteristics $C(V_{FG})$ of the transistor for different theoretical values of $\Delta D_{it2}$ are calculated by a Poisson-Schrödinger solver-type application from the values of the thickness of the semiconductor intended to form the transistor's channel, of the equivalent oxide thickness EOT of the gate dielectric of the transistor, of voltages $V_{BG}$ and $V_{FG}$ applied to the transistor, of the thickness of the buried dielectric $t_{Box}$ of the transistor, and of the temperature of the environment in which the transistor is operating.

5. The method according to claim 1, in which the value of $\Delta D_{it2}$ is determined by the following equation:

$$\Delta D_{it2} = \frac{\Delta V_{Lower}}{(\alpha \cdot t_{Si} + \beta \cdot EOT)}$$

Where α=1.25×10⁻⁴ mV·cm,
and β=4.5×10⁻⁴ mV·cm,
EOT: equivalent oxide thickness of the gate dielectric,
$t_{Si}$: thickness of the semiconductor intended to form the channel of the transistor.

6. The method according to claim 1, in which the value of $\Delta D_{it2}$ is determined, from a relation $\Delta V_{Lower}=f(\Delta D_{it2})$ which is known for the transistor, by calculating value $\Delta D_{it2}=f^{-1}(\Delta V_{Upper(t1)}-\Delta V_{Lower(t1)})$.

7. The method according to claim 1, in which voltage $V_{FG}$ includes a direct current component, the value of which is between approximately −2 V and 2 V, and a sinusoid alternating component, the frequency of which is between approximately 10 kHz and 100 kHz.

8. The method according to claim 1, in which capacitance C of the transistor is measured by an impedance analyser.

9. A device for measuring the changes of the electrical performance of an FDSOI transistor, including means for implementing a method for measuring changes of the electrical performance of the FDSOI transistor according to claim 1.

* * * * *